(12) United States Patent
Gehres et al.

(10) Patent No.: US 6,967,375 B2
(45) Date of Patent: Nov. 22, 2005

(54) REDUCTION OF CHEMICAL MECHANICAL PLANARIZATION (CMP) SCRATCHES WITH SACRIFICIAL DIELECTRIC POLISH STOP

(75) Inventors: Rainer E. Gehres, Wallkill, NY (US); George R. Goth, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 10/753,990

(22) Filed: Jan. 8, 2004

(65) Prior Publication Data
US 2005/0151192 A1    Jul. 14, 2005

(51) Int. Cl.[7] .............................................. H01L 27/01
(52) U.S. Cl. ...................... 257/347; 438/690; 438/710
(58) Field of Search ................................. 438/710, 690; 257/774, 775, 776

(56) References Cited

U.S. PATENT DOCUMENTS

| | | | |
|---|---|---|---|
| 4,388,344 A | 6/1983 | Shuskus et al. | |
| 6,087,191 A | 7/2000 | Boggs | |
| 6,426,295 B1 | 7/2002 | Kramer et al. | |
| 6,531,265 B2 | 3/2003 | Mei et al. | |
| 2002/0076936 A1 * | 6/2002 | Iguchi | |
| 2004/0147127 A1 * | 7/2004 | Noguchi et al. | |

* cited by examiner

*Primary Examiner*—David Nelms
*Assistant Examiner*—Mai-Huong Tran
(74) *Attorney, Agent, or Firm*—McGinn & Gibb, PLLC; Todd M. C. Li, Esq.

(57) ABSTRACT

Disclosed in a method of planarizing a silicon on insulator (SOI) structure. The invention performs a first chemical mechanical planarization (CMP) process on an insulator (e.g., oxide) layer. However, this first CMP process creates scratches on the insulator layer. The invention forms a polish stop insulator (e.g., nitride) over the insulator layer in, for example, a liquid phase chemical vapor deposition (LPCVD) process. The polish stop insulator fills in the scratches. The invention then forms an opening through the insulator layer and through the polish stop insulator (e.g., in a reactive ion etching (RIE) process) and deposits a conductor within the opening. The invention performs a second CMP process on the conductor. The polish stop insulator is harder than the insulating layer and prevents the second CMP process from scratching the insulator layer. The invention removes portions of the polish stop insulator to leave the polish stop insulator only within the scratches. The polish stop insulator within the scratches prevents short circuits across said insulator layer.

20 Claims, 5 Drawing Sheets

REDUCTION OF CHEMICAL MECHANICAL PLANARIZATION (CMP) SCRATCHES WITH SACRIFICIAL DIELECTRIC POLISH STOP

BACKGROUND OF THE INVENTION

1. Field of the Invention

The present invention generally relates to chemical mechanical planarization of oxides and more particularly to an improved method and structure that reduces or eliminates scratching of the oxides.

2. Description of the Related Art

During chemical mechanical planarization (CMP), the oxide that is used for device isolation in semiconductor processing is often scratched. Scratches in the oxide lead to reduction in wafer final test yields as these scratches can fill with conductive materials in downstream processes resulting in shorting of circuits. For example, in the silicon on insulator (SOI) process, after the initial oxide CMP, a second poly CMP process is needed for a substrate contact. The use of CMP twice in the isolation sector in SOI results in an unacceptable polish scratch defect density.

Current solutions focus on minimizing the number of scratches by improving slurries or pads used for CMP processes. These current solutions reduce, but do not eliminate scratches. In addition, as across wafer uniformity becomes increasingly important, the 'harder' pads used to improve uniformity increase scratch defect density. The current solutions also do not address minimizing the impact of a scratch once it is on the wafer.

SUMMARY OF THE INVENTION

The invention described below provides a method of planarizing a silicon on insulator (SOI) structure. The invention performs a first chemical mechanical planarization (CMP) process on an insulator (e.g., oxide) layer. However, this first CMP process creates scratches on the insulator layer. The invention forms a polish stop insulator (e.g., nitride) over the insulator layer in, for example, a liquid phase chemical vapor deposition (LPCVD) process. The polish stop insulator fills in the scratches.

The invention then forms an opening through the insulator layer and through the polish stop insulator (e.g., in a reactive ion etching (RIE) process) and deposits a conductor within the opening. The invention performs a second CMP process on the conductor. The polish stop insulator is harder than the insulating layer and prevents the second CMP process from scratching the insulator layer. The invention removes portions of the polish stop insulator, but leaves the polish stop insulator within the scratches thereby preventing conducting films from filling the scratches in subsequent processing. The polish stop insulator within said scratches prevents short circuits across said insulator layer.

This process produces a silicon on insulator (SOI) structure that includes an insulator layer separating two devices and a conductor extending through the insulator layer to an underlying substrate that extends below the devices. The insulator layer includes scratches filled with a polish stop insulator. These scratches comprise chemical mechanical planarization scratches. These scratches exist along the top of the insulating layer.

The inventive structure has a planarized upper surface; however, the only scratches remaining are filled with an insulator. Therefore, the methodology and resulting structure has a substantially reduced chance of containing a short circuit because the insulators act together to prevent short circuit between adjacent conductors.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
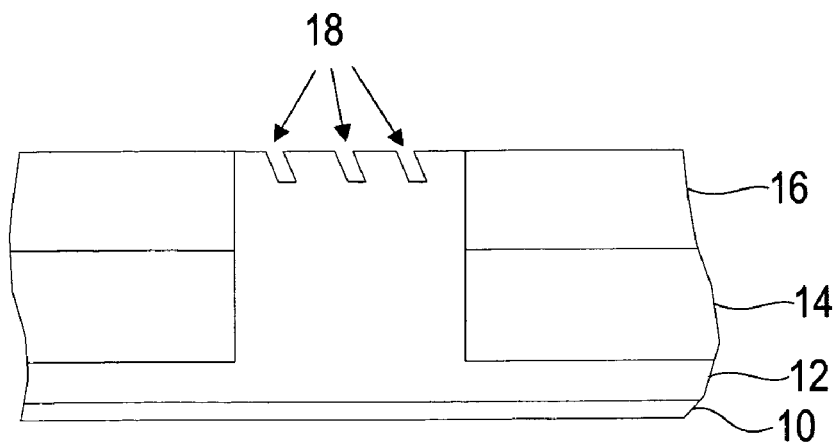
FIG. 1 is a schematic diagram of a partially completed integrated circuit structure.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As described in detail below, the invention provides an improved process and an improved resulting structure that utilizes a sacrificial polish stop insulator that protects an oxide during CMP processing. More specifically, FIGS. 1–3 illustrate the results of a structure that does not include such a polish stop layer.

More specifically, FIG. 1 illustrates a substrate 10, such as a polysilicon substrate, and item 12 represents some form of insulator, such as an oxide. The oxide 12 can be, for example, a shallow trench isolation region (insulator column) within a SOI structure. Items 14 and 16 represent other areas of the SOI structure that are insulated by insulator 12.

In this example, item 14 represents a conductive polysilicon connected to adjacent devices and item 16 represents a nitride cap. The oxide 12 has been polished in, for example, a CMP process, resulting in scratches 18 along the upper surface of the oxide 12.

Figure 2:
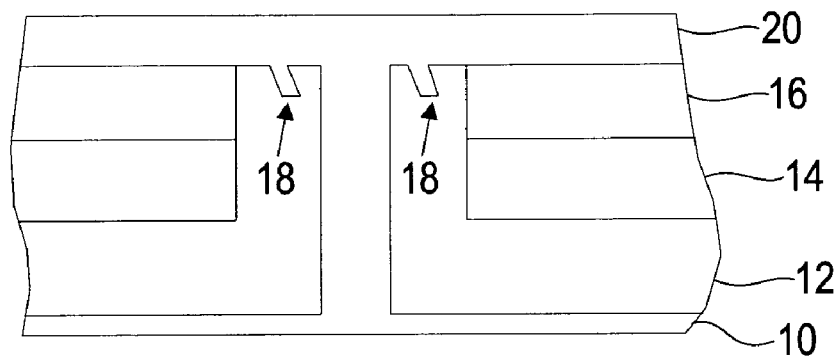
FIG. 2 is a schematic diagram of a partially completed integrated circuit structure.
Figure 3:
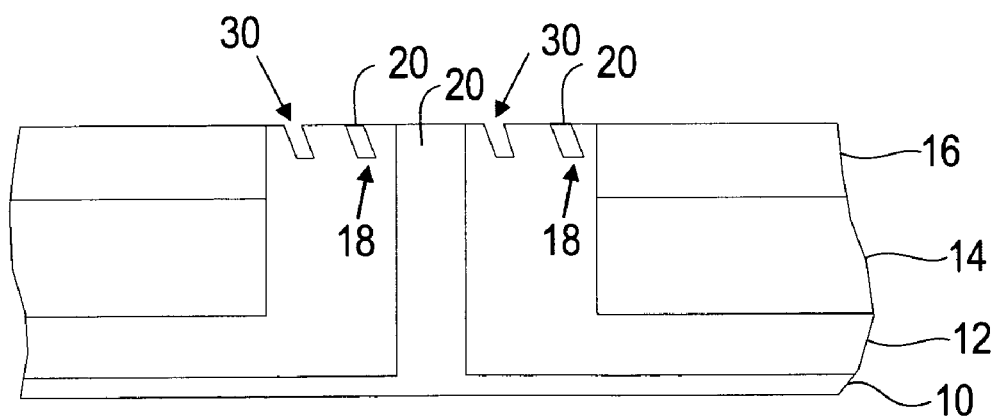
FIG. 3 is a schematic diagram of a partially completed integrated circuit structure.

In FIG. 2, an opening is formed in the oxide 12 and a conductor 20 such as polysilicon, etc. has been deposited in the opening such that the conductor 20 is in direct contact with the substrate 10. For example, a reactive ion etching (RIE) process performed with a conventional mask could be used to form such an opening. Conductors (such as item 20) are frequently used in silicon-on-insulator (SOI) structures in order to allow an electrical contact to an underlying layer, such as substrate 10.

In FIG. 3, the conductor 20 is polished in a second CMP process. This process not only creates additional scratches 30 in the oxide 12, but this process also leaves conductive material 20 within the previous scratches 18. These additional scratches 30 and the conductor 20 filled scratches 18 substantially increase the chance of a short circuit between the conductor 20 and the conductor 14 (and possibly other structures).

Figure 4:
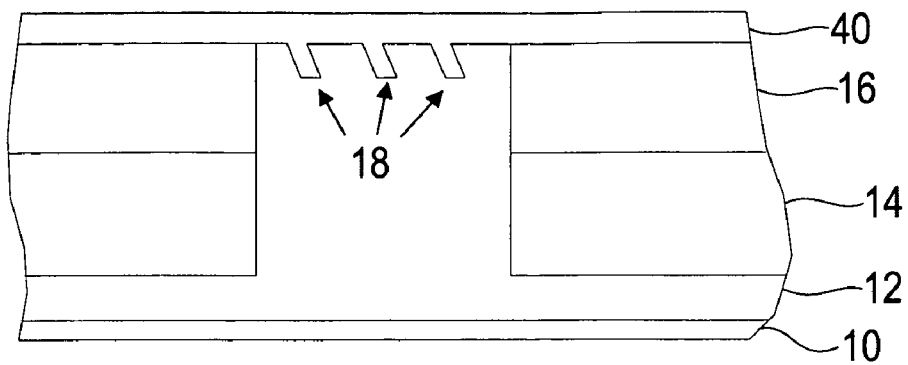
FIG. 4 is a schematic diagram of a partially completed integrated circuit structure.
Figure 5:
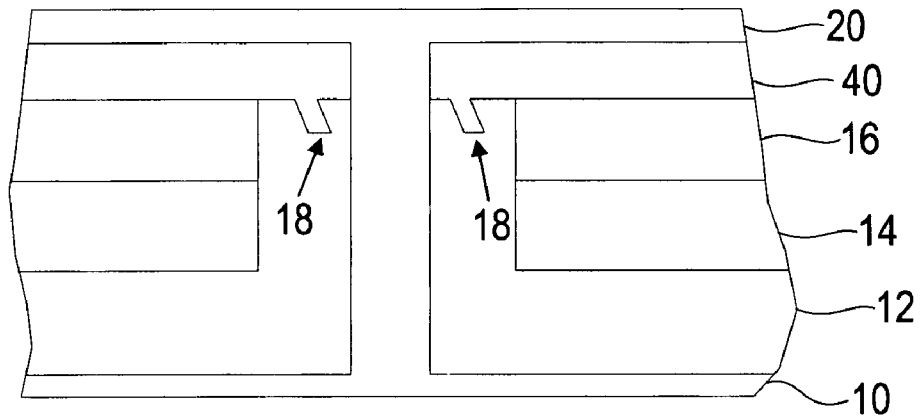
FIG. 5 is a schematic diagram of a partially completed integrated circuit structure.

FIG. 4 illustrates the same structure shown in FIG. 1; however, in FIG. 4 an insulator 40 has been deposited over the structure. The insulator 40 fills the scratches 18 in the top of the oxide 12. The insulator 40 is harder than the oxide 12 and therefore acts as a polish stop layer for the subsequent CMP processing. For example, the insulator 40 could comprise a nitride, lo K dielectric, SICOH etc. The insulator 40 is preferably formed in a liquid phase chemical vapor deposition (LPCVD) process which allows the insulator 40 to form a substantially flat layer and further allows the insulator 40 to easily fill the scratches 18.

In a similar manner to that shown above in FIG. 2, an opening is patterned through the insulator 40 and the oxide 12, and a conductor 20 is deposited to fill the opening and make contact with the underlying substrate 10.

Figure 6:
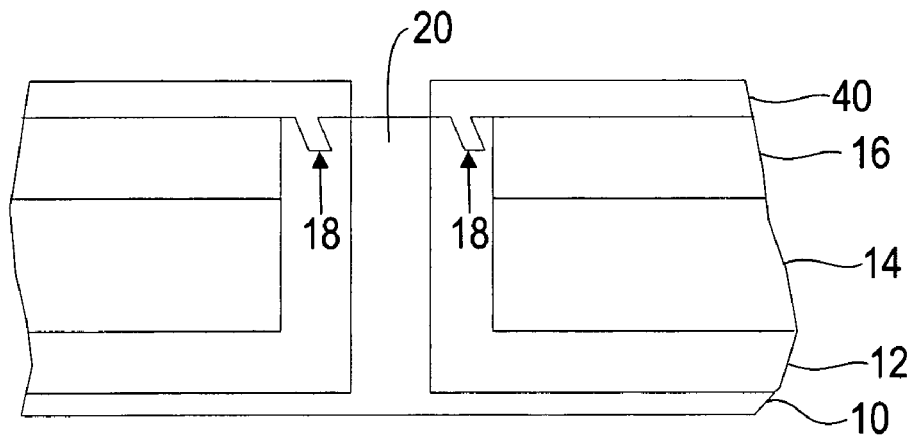
FIG. 6 is a schematic diagram of a partially completed integrated circuit structure.
Figure 7:
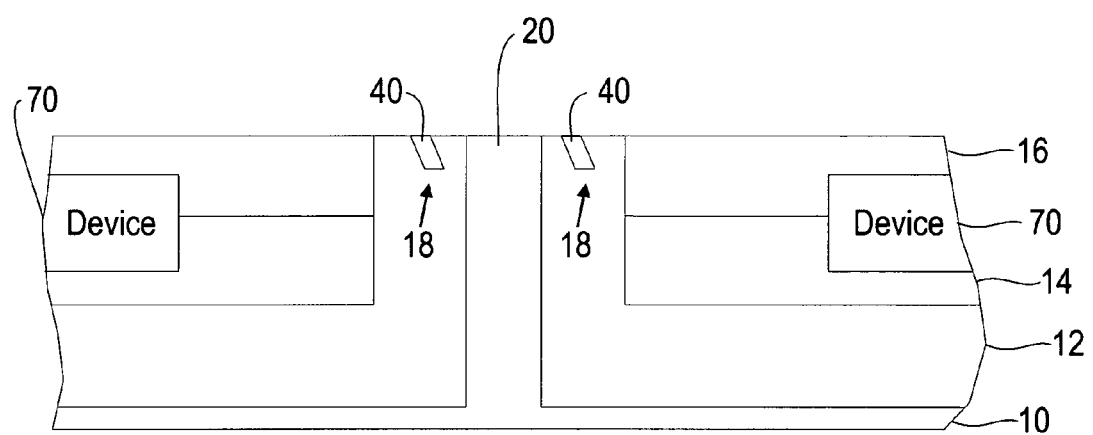
FIG. 7 is a schematic diagram of a partially completed integrated circuit structure.

Similarly to the processing shown FIG. 3, a second CMP process is performed to remove portions of the conductor 20 in FIG. 6. However, in FIG. 6, this second CMP process does not substantially affect the insulating polish stop layer 40. Therefore, this additional CMP process does not create additional scratches in the top of the oxide 12. This is in contrast to the additional scratches 30 shown in FIG. 3. Next, the invention removes the insulating polish stop layer 40, as shown in FIG. 7. More specifically, after the poly CMP process (FIG. 6), an anisotropic nitride reactive ion etch (RIE) can be used to remove the polish stop 40 (if a nitride) from the surface of the wafer, while leaving the insulating polish stop 40 in the prior level oxide CMP scratches 18.

This processing leaves the structure with a planarized upper surface; however, the only scratches remaining (18) are filled with an insulator 40. Therefore, the methodology and resulting structure shown in FIG. 7 has a substantially reduced chance of containing a short circuit because the insulators 12, 40 act together to prevent short circuits between the conductors 20, 14.

This process produces a silicon on insulator (SOI) structure that includes an insulator layer 12 (such as a shallow trench isolation region) separating two devices 70 (such as transistors, capacitors, etc.) and a conductor 20 extending through the insulator layer 12 to an underlying substrate 10 that extends below the devices 70. The insulator layer 12 includes scratches 18 filled with a polish stop insulator 40. These scratches 18 comprise chemical mechanical planarization scratches. These scratches 18 exist along the top of the insulating layer 12.

Figure 8:
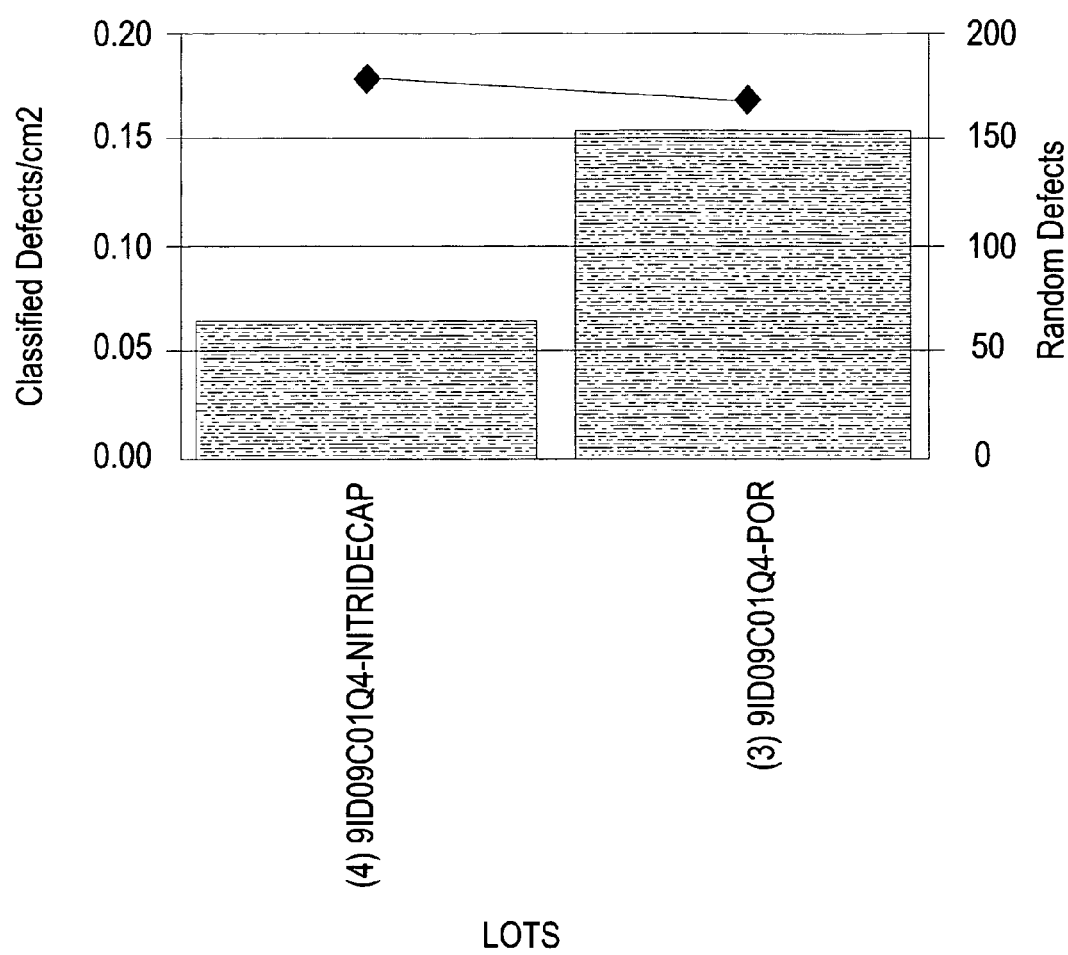
FIG. 8 it is a combined chart showing the defect reduction achieved in one embodiment of the invention.

Thus, as shown above, the invention utilizes a thin, sacrificial LPCVD film 40 deposited on the wafer immediately following the oxide CMP polish (FIG. 4). FIG. 8 shows the actual data showing the defect reduction. The dark bars in FIG. 8 illustrates a scratch defect density reduction in from 0.15 df/cm^2 to 0.06 df/cm^2 and an overall defect reduction from 180 to 160 and in a controlled experiment.

Figure 9:
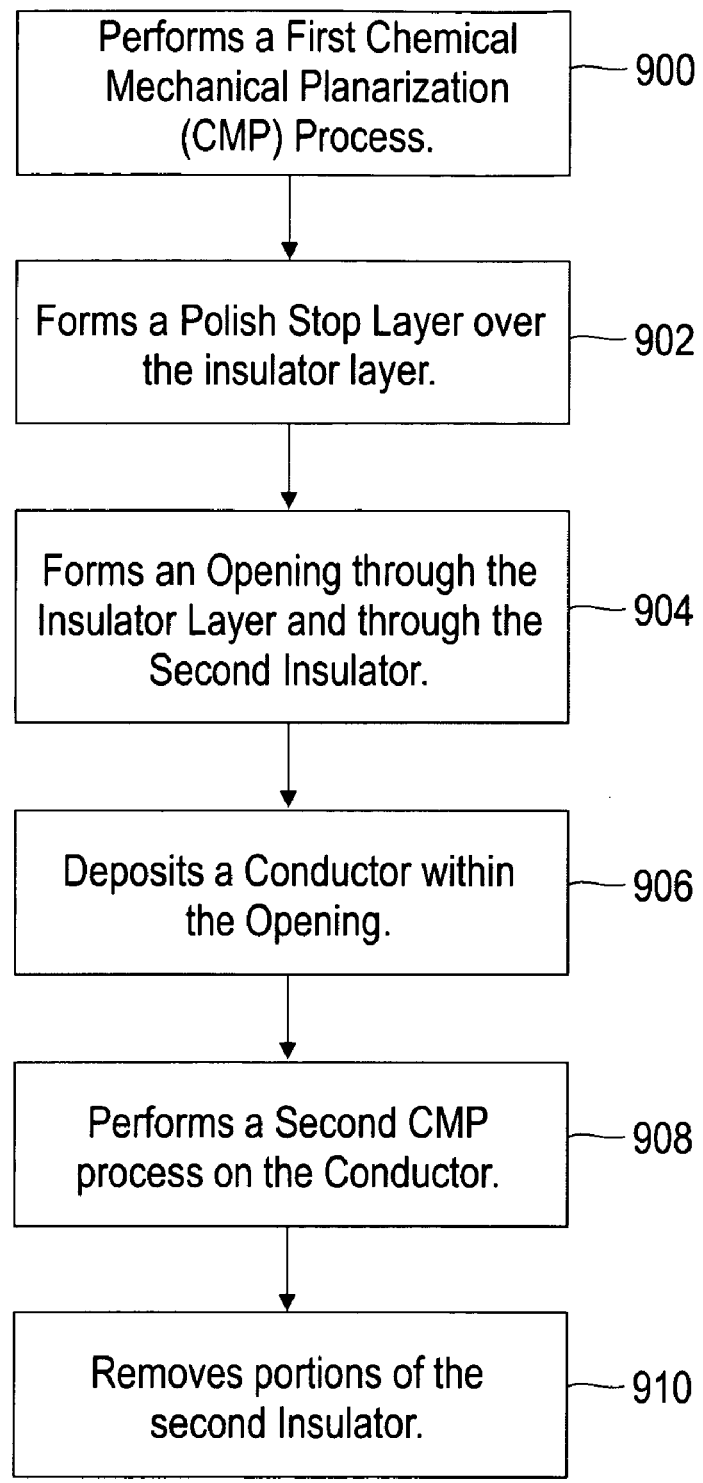
FIG. 9 is a flow diagram illustrating a preferred method of the invention.

FIG. 9 is a flowchart showing the processing achieved with the invention. More specifically, in item 900, the invention performs a first chemical mechanical planarization (CMP) process on the insulator (e.g., oxide) layer. As mentioned above, this first CMP process creates scratches on the insulator layer. The invention forms a polish stop insulator (e.g., nitride) over the insulator layer 902 in, for example, a liquid phase chemical vapor deposition (LPCVD) process. The polish stop insulator fills in the scratches.

The invention then forms an opening through the insulator layer and through the polish stop insulator 904 (e.g., in a reactive ion etching (RIE) process) and deposits a conductor within the opening 906. The invention performs a second CMP process on the conductor 908. The polish stop insulator is harder than the insulating layer and prevents the second CMP process from scratching the insulator layer. The invention removes portions of the polish stop insulator 910 but leaves the polish stop insulator only within the scratches. The polish stop insulator within the scratches prevents short circuits across the insulator layer.

The LPCVD film 40 acts as a polish stop and scratch barrier for the poly CMP as well as preventing the oxide CMP scratch from filling with a conductive film. Thus, the LPCVD film 40 acts as a polish stop for the subsequent poly CMP process as well as a fill for scratches from the oxide CMP process. This film 40 further reduces growth of these scratches from downstream wet oxide etches. The solution is superior to the existing solutions because the intrinsic defect density eliminates poly CMP scratches (FIG. 6). Thus, the cost of ownership for the CMP area is reduced because this process is less sensitive to the quality of the CMP slurry. Further, the probability of failure caused by oxide scratches is reduced by filling the scratch with a non-conductive material 40 and the scratches, by being filled with a non conductive layer which is not etched by wet oxide etches, also prevents the defects from becoming larger in downstream processing.

In addition to reducing scratch defect density and thereby improving yields, by reducing susceptibility to scratches, this invention also allows a relaxation of the scratch criteria for the oxide CMP process. This criteria relaxation allows for reduced costs in semiconductor fabrication by reducing tool down time. It also allows improved uniformity in oxide planarization as harder CMP pads can be used which improve across wafer uniformity at the expense of increased scratching.

While the invention has been described in terms of preferred embodiments, those skilled in the art will recognize that the invention can be practiced with modification within the spirit and scope of the appended claims.

What is claimed is:

1. A silicon on insulator (SOI) structure comprising:
an insulator layer separating two devices; and
a conductor extending through said insulator layer to an underlying substrate that extends below said devices, wherein said insulator layer includes scratches filled with a polish stop insulator.

2. The SOI structure in claim 1, wherein said scratches comprise chemical mechanical planarization scratches.

3. The SOI structure in claim 1, wherein said polish stop insulator is harder than said insulator layer.

4. The SOI structure in claim 1, wherein said insulator layer comprises an oxide and said polish stop insulator comprises a nitride.

5. The SOI structure in claim 1, wherein said scratches exist along the top of said insulator layer.

6. The SOI structure in claim 1, wherein said polish stop insulator within said scratches reduces short circuits across said insulator layer.

7. The SOI structure in claim 1, wherein a density of said scratches is less than approximately 0.08 df/cm$^2$.

8. A silicon on insulator (SOI) structure comprising:
an insulator layer separating two devices; and
a conductor extending through said insulator layer to an underlying substrate that is positioned below said devices,
wherein said insulator layer includes scratches filled with a polish stop insulator that reduces a likelihood of said scratches becoming larger during downstream wet oxide etches.

9. The SOI structure in claim 8, wherein said scratches comprise chemical mechanical planarization scratches.

10. The SOI structure in claim 8, wherein said polish stop insulator is harder than said insulator layer.

11. The SOI structure in claim 8, wherein said insulator layer comprises an oxide and said polish stop insulator comprises a nitride.

12. The SOI structure in claim 8, wherein said scratches exist along the top of said insulator layer.

13. The SOI structure in claim 8, wherein said polish stop insulator within said scratches reduces short circuits across said insulator layer.

14. The SOI structure in claim 8, wherein a density of said scratches is less than approximately 0.08 df/cm$^2$.

15. A silicon on insulator (SOI) structure comprising:
a shallow trench isolation structure filled with an insulator layer, wherein said shallow trench isolation structure separates two devices; and
a conductor extending through said shallow trench isolation structure to an underlying substrate that is positioned below said devices, wherein said insulator layer includes scratches filled with a polish stop insulator that reduces a likelihood of said scratches becoming larger during downstream wet oxide etches and wherein said polish stop insulator within said scratches reduces short circuits across said insulator layer.

16. The SOI structure in claim 15, wherein said scratches comprise chemical mechanical planarization scratches.

17. The SOI structure in claim 15, wherein said polish stop insulator is harder than said insulator.

18. The SOI structure in claim 15, wherein said insulating layer comprises an oxide and said polish stop insulator comprises a nitride.

19. The SOI structure in claim 15, wherein said scratches exist along the top of said insulating layer.

20. The SOI structure in claim 15, wherein a density of said scratches is less than approximately 0.08 df/cm$^2$.

* * * * *